United States Patent
Nakao et al.

(10) Patent No.: US 8,527,834 B2
(45) Date of Patent: Sep. 3, 2013

(54) INFORMATION PROCESSING DEVICE AND INFORMATION PROCESSING METHOD

(75) Inventors: Yoshihiro Nakao, Yokohama (JP); Isao Kimura, Yokohama (JP)

(73) Assignee: Alaxala Networks Corporation, Kanagawa (JP)

( * ) Notice: Subject to any disclaimer, the term of this patent is extended or adjusted under 35 U.S.C. 154(b) by 1802 days.

(21) Appl. No.: 11/677,216

(22) Filed: Feb. 21, 2007

(65) Prior Publication Data
US 2007/0300126 A1   Dec. 27, 2007

(30) Foreign Application Priority Data
Jun. 26, 2006 (JP) ................... 2006-175483

(51) Int. Cl.
G06F 11/10 (2006.01)
(52) U.S. Cl.
USPC ....................................... 714/758
(58) Field of Classification Search
USPC ....................................... 714/758
See application file for complete search history.

(56) References Cited

U.S. PATENT DOCUMENTS

| | | | | |
|---|---|---|---|---|
| 4,769,818 A * | 9/1988 | Mortimer | ........... | 714/755 |
| 5,740,188 A * | 4/1998 | Olarig | ........... | 714/763 |
| 6,397,365 B1 | 5/2002 | Brewer et al. | | |
| 6,567,900 B1 * | 5/2003 | Kessler | ........... | 711/157 |
| 6,584,595 B2 * | 6/2003 | Cypher | ........... | 714/763 |
| 6,622,217 B2 * | 9/2003 | Gharachorloo et al. | ........... | 711/141 |
| 6,622,225 B1 * | 9/2003 | Kessler et al. | ........... | 711/158 |
| 6,675,344 B1 * | 1/2004 | Sharma | ........... | 714/763 |
| 6,677,864 B2 * | 1/2004 | Khayrallah | ........... | 341/50 |
| 7,028,248 B2 * | 4/2006 | Chen et al. | ........... | 714/785 |
| 7,539,929 B1 * | 5/2009 | Stern et al. | ........... | 714/785 |
| 7,721,178 B2 * | 5/2010 | Dell et al. | ........... | 714/752 |
| 8,185,697 B1 * | 5/2012 | Collard et al. | ........... | 711/141 |

FOREIGN PATENT DOCUMENTS

| | | |
|---|---|---|
| JP | 05-197580 | 8/1993 |
| JP | 08-037464 | 2/1996 |
| JP | 11-298448 | 10/1999 |
| JP | 2001-5736 | 1/2001 |

* cited by examiner

*Primary Examiner* — Stephen M Baker
(74) *Attorney, Agent, or Firm* — Brundidge & Stanger, P.C.

(57) ABSTRACT

An information processing device implements error control including at least one of error detection and error correction. The device comprises an information bit sequence acquiring unit and an encoder. The information bit sequence acquiring unit acquires an information bit sequence. The encoder generates a redundant bit sequence enabling execution of error control of the entire information bit sequence, the redundant bit sequence being generated through encoding by a predetermined code based on the information bit sequence and generates a codeword that includes the information bit sequence and the redundant bit sequence. The encoder generates the redundant bit sequence in such a way that one or more bits contained in the redundant bit sequence each functions as a parity bit for one of a plurality of divided information bit sequences produced by dividing the information bit sequence.

9 Claims, 15 Drawing Sheets

| S(16) | EL(10) | S(16) | EL(10) | S(16) | EL(10) | S(16) | EL(10) | S(16) | EL(10) | S(16) | EL(10) |
|---|---|---|---|---|---|---|---|---|---|---|---|
| 001 | 143 | 0C4 | 9 | 1E1 | 93 | 2E4 | 29 | 444 | 6 | 5C4 | 28 |
| 002 | 142 | 0F1 | 94 | 1E2 | 58 | 301 | 72 | 450 | 118 | 601 | 70 |
| 004 | 141 | 0F2 | 59 | 1E4 | 23 | 302 | 37 | 460 | 114 | 602 | 35 |
| 010 | 140 | 0F4 | 24 | 200 | 135 | 304 | 2 | 471 | 95 | 604 | 0 |
| 020 | 139 | 100 | 136 | 211 | 86 | 310 | 126 | 472 | 60 | 610 | 115 |
| 031 | 90 | 111 | 87 | 212 | 51 | 320 | 123 | 474 | 25 | 620 | 111 |
| 032 | 55 | 112 | 52 | 214 | 16 | 340 | 121 | 481 | 73 | 631 | 96 |
| 034 | 20 | 114 | 17 | 221 | 81 | 380 | 120 | 482 | 38 | 632 | 61 |
| 040 | 138 | 121 | 82 | 222 | 46 | 391 | 104 | 484 | 3 | 634 | 26 |
| 051 | 89 | 122 | 47 | 224 | 11 | 392 | 69 | 490 | 117 | 640 | 108 |
| 052 | 54 | 124 | 12 | 230 | 129 | 394 | 34 | 4A0 | 113 | 651 | 102 |
| 054 | 19 | 141 | 78 | 241 | 77 | 3C1 | 92 | 4B1 | 101 | 652 | 67 |
| 061 | 84 | 142 | 43 | 242 | 42 | 3C2 | 57 | 4B2 | 66 | 654 | 32 |
| 062 | 49 | 144 | 8 | 244 | 7 | 3C4 | 22 | 4B4 | 31 | 680 | 106 |
| 064 | 14 | 160 | 132 | 250 | 128 | 400 | 134 | 4C0 | 110 | 700 | 105 |
| 080 | 137 | 171 | 100 | 260 | 125 | 411 | 85 | 501 | 71 | 711 | 97 |
| 091 | 88 | 172 | 65 | 281 | 74 | 412 | 50 | 502 | 36 | 712 | 62 |
| 092 | 53 | 174 | 30 | 282 | 39 | 414 | 15 | 504 | 1 | 714 | 27 |
| 094 | 18 | 181 | 75 | 284 | 4 | 421 | 80 | 510 | 116 | 721 | 103 |
| 0A1 | 83 | 182 | 40 | 290 | 127 | 422 | 45 | 520 | 112 | 722 | 68 |
| 0A2 | 48 | 184 | 5 | 2A0 | 124 | 424 | 10 | 540 | 109 | 724 | 33 |
| 0A4 | 13 | 190 | 133 | 2C0 | 122 | 430 | 119 | 580 | 107 | 781 | 91 |
| 0C1 | 79 | 1A0 | 131 | 2E1 | 99 | 441 | 76 | 5C1 | 98 | 782 | 56 |
| 0C2 | 44 | 1C0 | 130 | 2E2 | 64 | 442 | 41 | 5C2 | 63 | 784 | 21 |

| S(16) | EL(10) | S(16) | EL(10) | S(16) | EL(10) | S(16) | EL(10) | S(16) | EL(10) |
|---|---|---|---|---|---|---|---|---|---|
| 001 | 143 | 0A4 | 48 | 178 | 30 | 282 | 74 | 428 | 10 | 5C8 | 28 |
| 002 | 142 | 0A8 | 13 | 181 | 105 | 284 | 39 | 430 | 117 | 601 | 108 |
| 004 | 141 | 0C2 | 79 | 182 | 75 | 288 | 4 | 442 | 76 | 602 | 70 |
| 008 | 140 | 0C4 | 44 | 184 | 40 | 2E2 | 99 | 444 | 41 | 604 | 35 |
| 010 | 139 | 0C8 | 9 | 188 | 5 | 2E4 | 64 | 448 | 6 | 608 | 0 |
| 020 | 138 | 0D0 | 122 | 190 | 128 | 2E8 | 29 | 460 | 123 | 610 | 118 |
| 031 | 111 | 0E0 | 115 | 1A0 | 121 | 302 | 72 | 472 | 95 | 632 | 96 |
| 032 | 90 | 0F2 | 94 | 1C0 | 114 | 304 | 37 | 474 | 60 | 634 | 61 |
| 034 | 55 | 0F4 | 59 | 1E2 | 93 | 308 | 2 | 478 | 25 | 638 | 26 |
| 038 | 20 | 0F8 | 24 | 1E4 | 58 | 320 | 127 | 481 | 109 | 640 | 126 |
| 040 | 137 | 100 | 135 | 1E8 | 23 | 340 | 120 | 482 | 73 | 652 | 102 |
| 052 | 89 | 111 | 107 | 200 | 134 | 380 | 113 | 484 | 38 | 654 | 67 |
| 054 | 54 | 112 | 87 | 212 | 86 | 392 | 104 | 488 | 3 | 658 | 32 |
| 058 | 19 | 114 | 52 | 214 | 51 | 394 | 69 | 490 | 132 | 680 | 119 |
| 061 | 106 | 118 | 17 | 218 | 16 | 398 | 34 | 4B2 | 101 | 700 | 112 |
| 062 | 84 | 122 | 82 | 222 | 81 | 3C2 | 92 | 4B4 | 66 | 712 | 97 |
| 064 | 49 | 124 | 47 | 224 | 46 | 3C4 | 57 | 4B8 | 31 | 714 | 62 |
| 068 | 14 | 128 | 12 | 228 | 11 | 3C8 | 22 | 4C0 | 129 | 718 | 27 |
| 070 | 116 | 130 | 131 | 230 | 124 | 400 | 133 | 502 | 71 | 722 | 103 |
| 080 | 136 | 142 | 78 | 241 | 110 | 412 | 85 | 504 | 36 | 724 | 68 |
| 092 | 88 | 144 | 43 | 242 | 77 | 414 | 50 | 508 | 1 | 728 | 33 |
| 094 | 53 | 148 | 8 | 244 | 42 | 418 | 15 | 510 | 125 | 782 | 91 |
| 098 | 18 | 172 | 100 | 248 | 7 | 422 | 80 | 5C2 | 98 | 784 | 56 |
| 0A2 | 83 | 174 | 65 | 260 | 130 | 424 | 45 | 5C4 | 63 | 788 | 21 |

Fig.16

| | PARITY ERROR | | | | FAULTY PATHWAY |
|---|---|---|---|---|---|
| | $p_7$ | $p_8$ | $p_9$ | $p_{10}$ | |
| CASE 1 | ○ | ○ | — | — | FBx |
| CASE 2 | — | — | ○ | ○ | FBy |
| CASE 3 | — | — | ○ | | FBy |

ABSTRACT# INFORMATION PROCESSING DEVICE AND INFORMATION PROCESSING METHOD

CROSS REFERENCE TO RELATED APPLICATIONS

The present application claims the priority based on Japanese Patent Application No. 2006-175483 filed on Jun. 26, 2006, the disclosure of which is hereby incorporated herein by reference in its entirety.

BACKGROUND

1. Technical Field

The present invention relates to information processing, and in particular relates to information processing for the purpose of implementing error control such as error detection and error correction.

2. Description of the Related Art

When digital information is transferred, recorded or reproduced, in some instances errors can occur in portions of the digital information, due for example to the effects of alpha rays or other cosmic rays, to a defect on the transmission path, and so on. There are known technologies that employ error detecting code or error correction code in order to detect such errors and correct any detected errors. There is no fundamental difference between an error detecting code and an error correction code, and they may be referred to collectively as error control codes. Similarly, error detection and error correction may be referred to collectively as error control.

In transferring or recording digital information using error control codes, for example, m-bit error control information (redundant bits) is appended to k-bit digital information (information bits) to generate a (k+m)-bit codeword, and this codeword is then transferred. At the transfer destination of the codeword, error detection or error correction is performed using the redundant bits contained in the codeword. The process of generating the codeword is termed "encoding"; the process of error detection or error correction based on the codeword is termed "decoding."

Various codes for the purpose of error control are known. For example, JP-H5-197580A discloses an error control code capable of correcting one-bit errors, as well as detecting two-bit errors.

With a view to further improving reliability during transfer or recording of digital information, it is preferable to employ error control codes having high error correction/error detection capability. However, where codes with high error correction/error detection capability are used, the bit length of the redundant bits tends to be longer, and efficiency of transfer of information tends to decline.

SUMMARY

An object of the present invention is to provide a technology whereby it is possible to improve the accuracy of error correction/detection, while minimizing increase in the bit length of the redundant bits.

In one aspect of the present invention, there is provided an information processing device for implementing error control including at least one of error detection and error correction. The device comprises an information bit sequence acquiring unit and an encoder. The information bit sequence acquiring unit acquires an information bit sequence. The encoder generates a redundant bit sequence enabling execution of error control of the entire information bit sequence, the redundant bit sequence being generated through encoding by a predetermined code based on the information bit sequence and generates a codeword that includes the information bit sequence and the redundant bit sequence. The encoder generates the redundant bit sequence in such a way that one or more bits contained in the redundant bit sequence each functions as a parity bit for one of a plurality of divided information bit sequences produced by dividing the information bit sequence.

In accordance with this information processing device, the codeword generated by the encoder contains a redundant bit sequence enabling execution of error control of the entire information bit sequence, whereby it is possible to implement error control of the entire information bit sequence. Furthermore, in accordance with this information processing device, one or more bits contained in the redundant bit sequence each functions also as a parity bit for one of a plurality of divided information bit sequences produced by dividing the information bit sequence. With this information processing device, it is therefore possible for error detection to be implemented in the divided information bit sequences, due to the presence of the parity bit. Consequently, in this device, the accuracy of error correction/detection in error control can be improved, while minimizing increase in the bit length of the redundant bits.

In other aspect of the present invention, there is provided an information processing device for implementing error control including at least one of error detection and error correction. The device comprises a codeword acquiring unit and a decoder. The codeword acquiring unit acquires a codeword including an information bit sequence and a redundant bit sequence, the redundant bit sequence being generated through encoding by a predetermined code and enabling execution of error control of the entire information bit sequence, the redundant bit sequence having a bit that functions as a parity bit for at least one of a plurality of divided information bit sequences produced by dividing the information bit sequence. The decoder performs decoding based on the codeword. The decoder performs error control in the entire information bit sequence based on the redundant bit sequence and performs error detection in the divided information bit sequence based on the bit belonging to the redundant bit sequence and functioning as a parity bit.

In accordance with this information processing device, the decoder can perform error control in the entire information bit sequence based on the redundant bit sequence. Furthermore, the decoder can perform error detection in divided information bit sequences based on bits belonging to the redundant bit sequence and functioning as parity bits. Consequently, in this device, the accuracy of error correction/detection in error control can be improved, while minimizing increase in the bit length of the redundant bits.

The present invention can be realized in various aspects. For example, the present invention can be realized in aspects such as an information processing method and associated apparatus, an error correction method and associated apparatus, a data transfer method and associated apparatus, a data record method and associated apparatus, a data reproduction method and associated apparatus, a network relay apparatus, a computer program that executes the functions of these methods and apparatuses, a recording medium on which such computer program is recorded, a computer program product that includes this recording medium, or a data signal encoded in a carrier wave that incorporates this computer program.

These and other objects, features, aspects, and advantages of the present invention will become more apparent from the following detailed description of the preferred embodiments with the accompanying drawings.

BRIEF DESCRIPTION OF THE DRAWINGS

FIG. 5 is a diagram depicting an exemplary redundant bit generator matrix P in Embodiment 1;

FIG. 7 is a diagram depicting an exemplary check matrix H in Embodiment 1;

FIG. 8 is a diagram depicting an exemplary error location correspondence table CT in Embodiment 1;

FIG. 14 is a diagram depicting an exemplary check matrix H in Embodiment 2;

FIG. 15 is a diagram depicting an exemplary error location correspondence table CT in Embodiment 2; and FIG. 16 is a diagram showing an exemplary method of identifying a faulty pathway using the parity bit.

DESCRIPTION OF THE PREFERRED EMBODIMENT

Next, aspects of the present invention will be described in the following order on the basis of embodiments:
A. Embodiment 1
B. Embodiment 2
C. Variations

A. Embodiment 1

Figure 1:
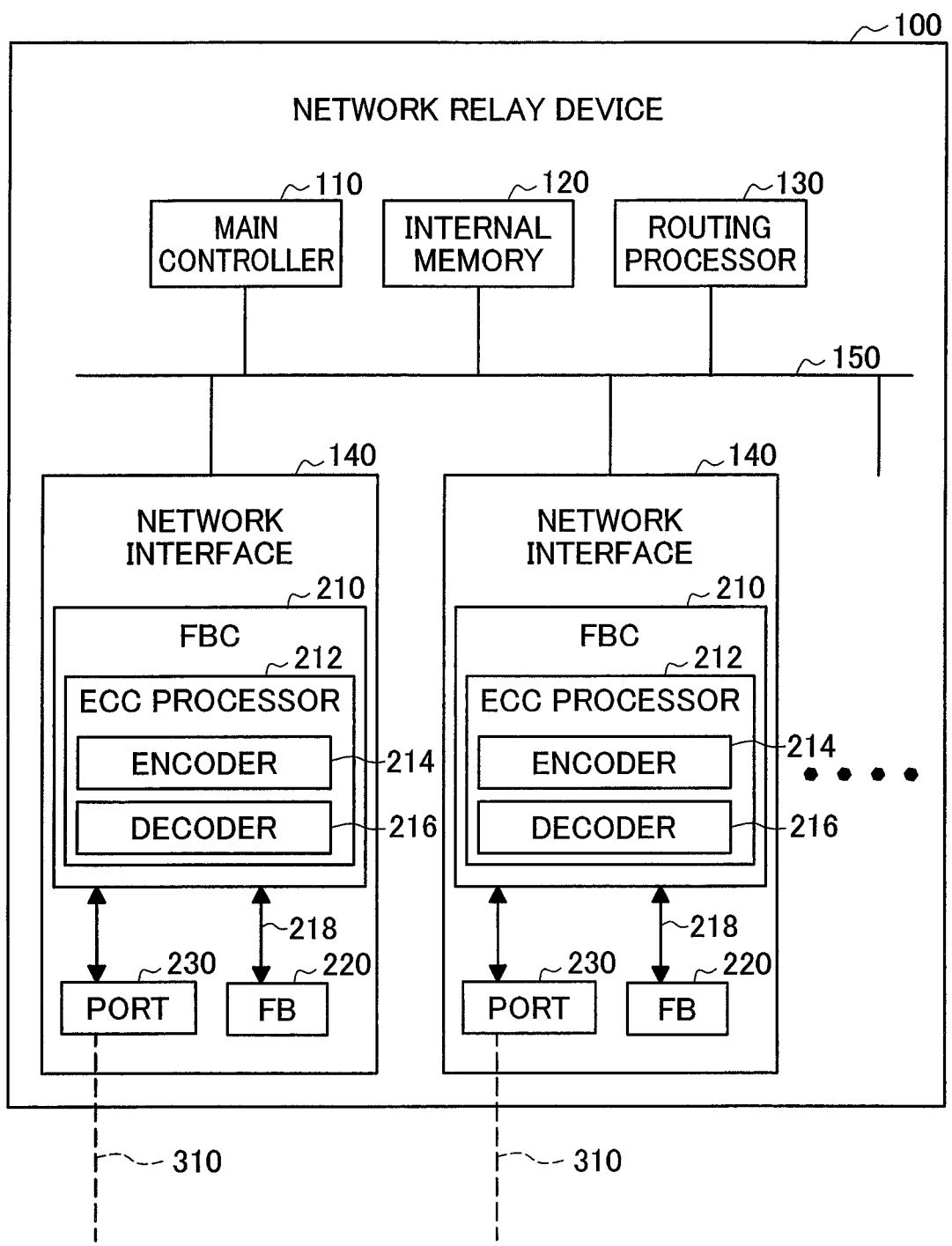
FIG. 1 is a diagram depicting schematically configuration of a network relay device 100 in accordance with Embodiment 1 of the present invention.

FIG. 1 is a diagram depicting schematically configuration of a network relay device 100 in accordance with Embodiment 1 of the present invention. The network relay device 100 is a device for relaying information (data) transmitted among hosts on a network. The network relay device 100 of the present embodiment is a so-called "switch" that relays data referred to as "frames" or "frame data" in the third layer (Layer 3) of the OSI reference model.

The network relay device 100 comprises a main controller 110, an internal memory 120, a routing processor 130, and a plurality of network interfaces 140. The various elements of the network relay device 100 are interconnected via a bus 150. While two network interfaces 140 are shown in FIG. 1, the network relay device 100 may include three or more network interfaces 140.

The main controller 110 is composed of a general purpose CPU for example, and is used to control the operations of the network relay device 100 overall. The internal memory 120 stores data, computer programs, and the like for use by the main controller 110. The routing processor 130 is composed of an ASIC (application-specific IC), and is used to perform routing of frame data.

The network interfaces 140 are used for sending and receiving frame data via links 310 as data transmission paths over the network. The network interfaces 140 each include a frame buffer controller (hereinafter "FBC") 210, a frame buffer (hereinafter "FB") 220, and a port 230.

The port 230 is connected to the link 310, and functions as an opening for input/output of frame data. The frame buffer 220 is a memory area for temporarily storing frame data. The frame buffer controller 210 controls the frame buffer 220. Specifically, via a bus 218 the frame buffer controller 210 writes frame data to the frame buffer 220 and reads frame data from the frame buffer 220.

Frame data input to a network interface 140 via a port 230 is temporarily written by the frame buffer controller 210 to a predetermined area on the frame buffer 220. Subsequently, the frame data is read from the frame buffer 220 by the frame buffer controller 210, and under the control of the routing processor 130 is transferred to another network interface 140. Frame data input to this other network interface 140, after being temporarily written by the frame buffer controller 210 and read from the frame buffer 220 by the frame buffer controller 210, is then sent out over the network from the port 230.

The frame buffer controller 210 also includes an error correction processor (hereinafter "ECC processor") 212. The ECC processor 212 has an encoder 214 and a decoder 216. The ECC processor 212 and its constituent elements (i.e. the encoder 214 and the decoder 216) may be configured as dedicated circuits, for example. The ECC processor 212 performs encoding of data during writing of data to the frame buffer 220 by the frame buffer controller 210, as well as performing decoding of data during readout of data from the frame buffer 220. These processes will be discussed in more detail later.

Figure 2:
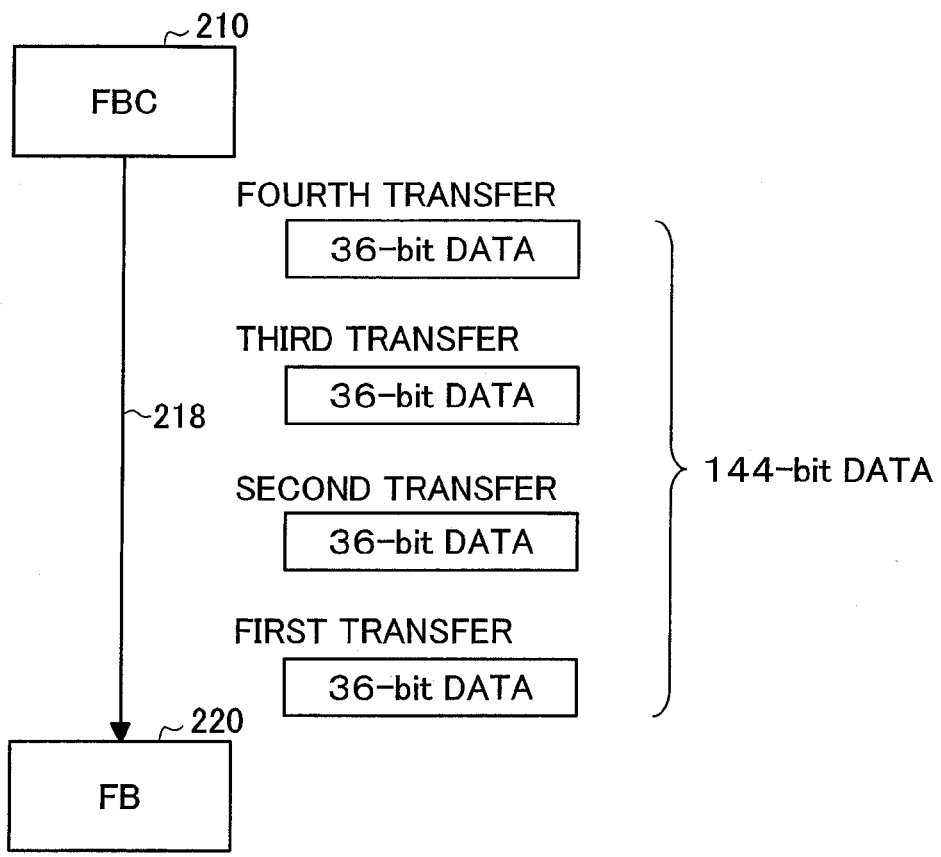
FIG. 2 is a diagram showing an exemplary method of data transfer between the frame buffer controller 210 and the frame buffer 220 in Embodiment 1.

FIG. 2 is a diagram showing an exemplary method of data transfer between a frame buffer controller 210 and a frame buffer 220 in Embodiment 1. FIG. 2 depicts an instance of transfer of data from the frame buffer controller 210 to the frame buffer 220 for the purpose of writing the data. In the present embodiment, the bus 218 between the frame buffer controller 210 and the frame buffer 220 has 36-bit bus width. Consequently, as shown in FIG. 2, in the case of transfer of 144-bit data for example, transfer is carried out through burst transfer in transfer units of 36-bit data. Herein, among individual transfers taking place during such burst transfer, the n-th transfer shall be denoted as the "n-th unit transfer." Similarly, data transfer from the frame buffer 220 to the frame buffer controller 210 is carried out through burst transfer by unit transfer of 36-bit data.

Figure 3:
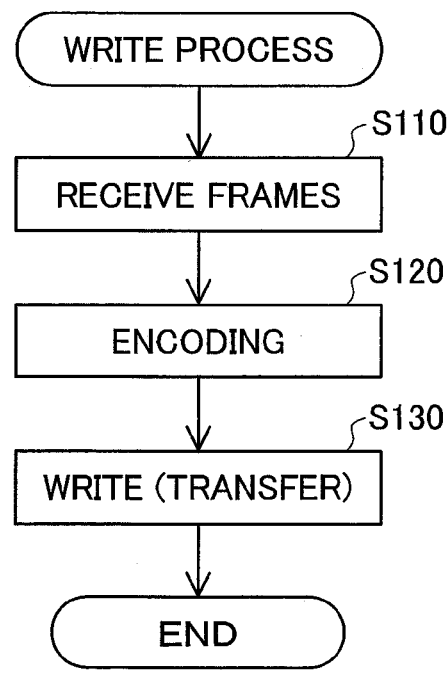
FIG. 3 is a flowchart depicting the flow of the frame data write process in Embodiment 1.

FIG. 3 is a flowchart depicting the flow of the frame data write process in Embodiment 1. The frame data write process is a process whereby the frame buffer controller 210 (FIG. 1) temporarily stores frame data in the frame buffer 220. In Step S110, the frame buffer controller 210 receives the frame data via the port 230.

In Step S120 (FIG. 3), the encoder 214 (FIG. 1) of the frame buffer controller 210 performs encoding of the frame data. Encoding of the frame data is a process for generating, on the basis of the frame data, redundant data (hereinafter "ECC data") for the purpose of detecting/correcting errors in the frame data, and appending the ECC data to the frame data. The data prior to encoding (in the present embodiment, the frame data) is typically referred to as a "message." The data subsequent to encoding (in the present embodiment, the frame data with the appended ECC data) is typically referred to as a "codeword."

Figure 4A:
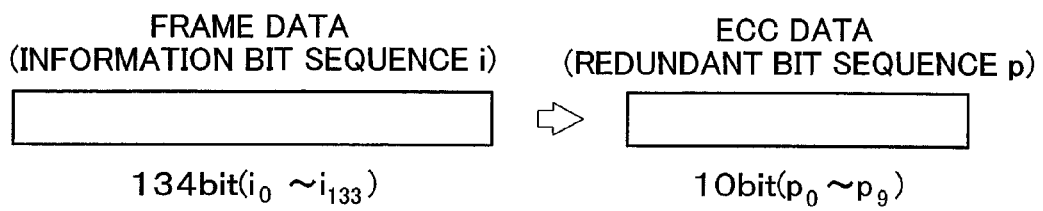
FIGS. 4A and 4B are diagrams showing an exemplary method of encoding frame data in Embodiment 1.
Figure 4B:
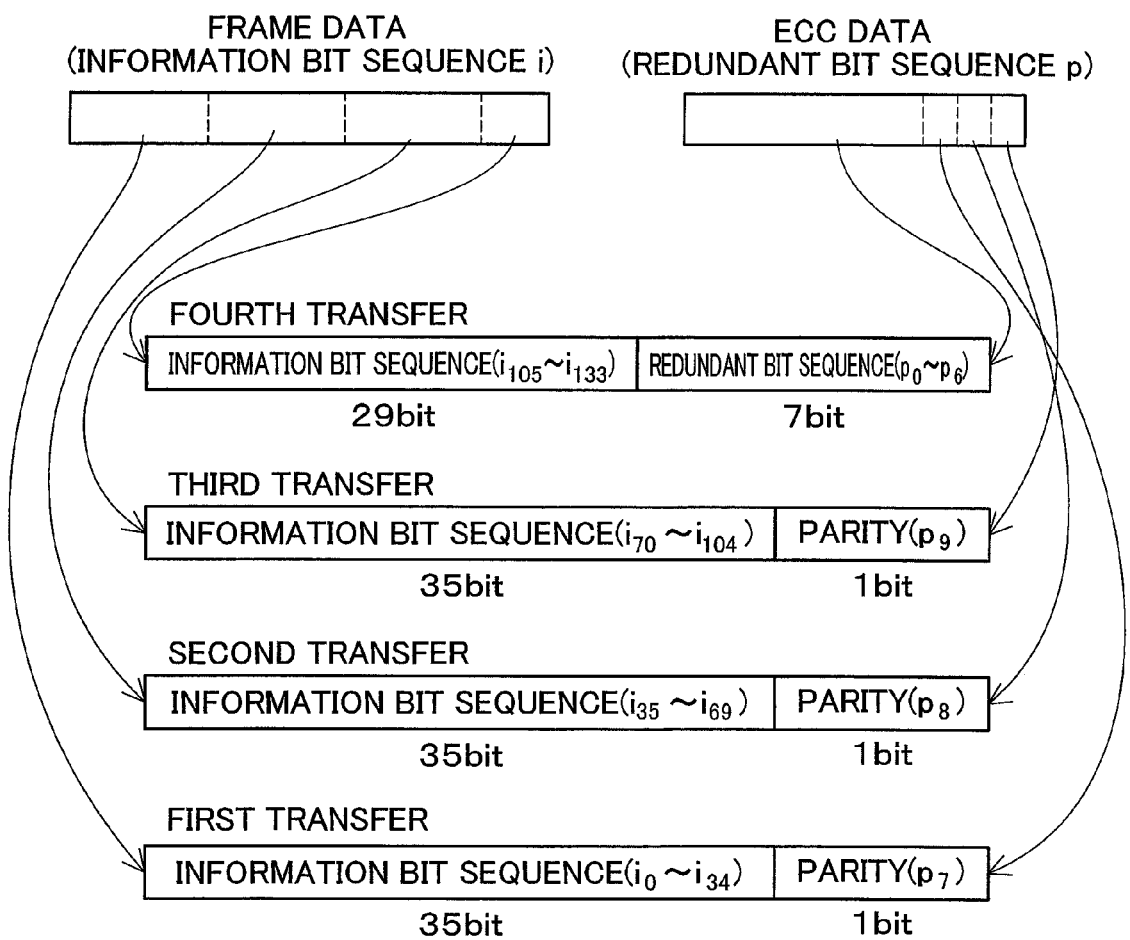

FIGS. 4A and 4B are diagrams showing an exemplary method of encoding frame data in Embodiment 1. As shown in FIG. 4A, during encoding of frame data, ECC data is generated on the basis of the frame data. In Embodiment 1, frame data consists of a 134-bit bit sequence (hereinafter termed "information bit sequence i"). The information bit sequence i is denoted as i={$i_0$, $i_1$, ... $i_{133}$}. The ECC data consists of a 10-bit bit sequence (hereinafter termed "redundant bit sequence p"). The redundant bit sequence p is denoted as p={$p_0$, $p_1$, ... $p_9$}. The information bit sequence i and the redundant bit sequence p can be viewed as single-row matrices. Here, the redundant bit sequence p can be derived by Equation (1).

$$p = Pi^T \quad (1)$$

In Equation (1), $i^T$ denotes a transposed matrix of the matrix i. P is a 10×134 matrix. This matrix P is termed the "redundant bit generator matrix." From Equation (1), where the element at the intersection of row m and column k in the redundant bit generator matrix P is denoted as Pm,k, the first element $p_0$ of the redundant bit sequence p, for example, can be derived with Equation (2).

$$p_0 = P_{1,1} \times i_0 + P_{1,2} \times i_1 + \ldots + P_{1,134} \times i_{133} \quad (2)$$

The addition symbol "+" denotes exclusive OR.

Figure 5:
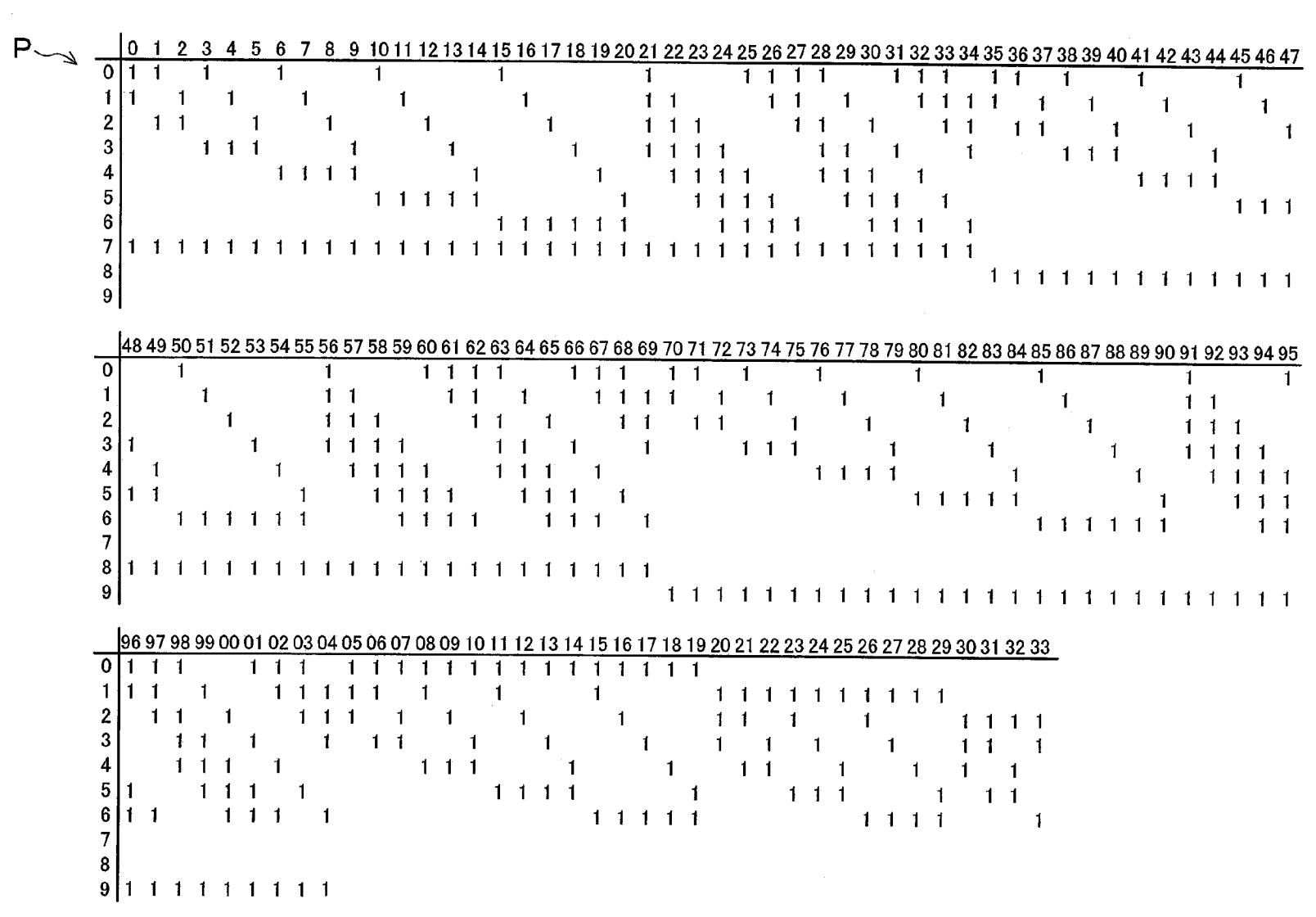

FIG. 5 is a diagram depicting an exemplary redundant bit generator matrix P in Embodiment 1. In FIG. 5, for convenience in illustration, the redundant bit generator matrix P is shown divided in three parts. For reference, the row numbers and column numbers of the redundant bit generator matrix P are shown in FIG. 5. Column numbers starting with #100 are shown with the hundreds place omitted. Among the elements of the redundant bit generator matrix P, elements having a value of "0" are not shown in the drawing. The convention in labeling the rows and columns will be used hereinafter as well.

As shown in FIG. 5, the combinations of elements having a value of "0" and elements having a value of "1" in each column (Column 0 to Column 133) of the redundant bit generator matrix P all differ from one another. The number of elements having a value of "1" in each column (e.g. three in Column 0) is an odd number. Encoding carried out using the redundant bit generator matrix P set up in this way makes possible single-bit error correction and double-bit error detection.

Furthermore, in the redundant bit generator matrix P (FIG. 5) in Embodiment 1, it will be noted that in the bit sequence of Row 7, the 35 elements from Column 0 to Column 34 all have a value of "1," while the rest of the elements in the row all have a value of "0." Thus, Element 7 $p_7$ of the redundant bit sequence p derived using the redundant bit generator matrix P will be equivalent to addition of Element 0 $i_0$ through Element 34 $i_{34}$ of the redundant bit sequence p. That is, Element 7 $p_7$ of the redundant bit sequence p will constitute a parity bit (even parity) of Element 0 $i_0$ to Element 34 $i_{34}$ of the information bit sequence i. Herein, "parity bit" refers to the redundant bit in single parity check encoding.

Similarly, in the bit sequence of Row 8 of the redundant bit generating matrix P (FIG. 5), the 35 elements from Column 35 to Column 69 all have a value of "1," while the rest of the elements in the row all have a value of "0." Also, in the bit sequence of Row 9 of the redundant bit generating matrix P, the 35 elements from Column 70 to Column 104 all have a value of "1," while the rest of the elements in the row all have a value of "0." Thus, Element 8 $p_8$ of the redundant bit sequence p will constitute a parity bit of Element 35 $i_{35}$ to Element 69 $i_{69}$ of the information bit sequence i. Element 9 $p_9$ of the redundant bit sequence p will constitute a parity bit of Element 70 $i_{70}$ to Element 104 $i_{104}$ of the information bit sequence i.

Thus, in Embodiment 1, the redundant bit sequence p generated as ECC data function as ECC data for implementing single-bit error correction and double-bit error detection, as well as containing parity bits for bit sequences, each of predetermined bit length, into which the information bit sequence i constituting the frame data has been divided (hereinafter termed "divided bit sequences"). FIG. 4B shows relationships among divided bit sequences and elements of redundant bit sequence p functioning as parity bits.

In Step S130 (FIG. 3), the frame buffer controller 210 (FIG. 1) writes the encoded frame data to the frame buffer 220. Specifically, the information bit sequence i and the redundant bit sequence p are transferred from the frame buffer controller 210 to the frame buffer 220. As mentioned earlier, in the present embodiment, data transfers from the frame buffer controller 210 to the frame buffer 220 are carried out through burst transfer by successive unit transfers of 36-bit data. Since the total number of bits of the information bit sequence i and the redundant bit sequence p is 144-bit, transfer will be carried out over a series of four unit transfers.

FIG. 4B depicts data transfer from the frame buffer controller 210 to the frame buffer 220. As shown in FIG. 4B, the initial first unit transfer involves transferring a total of 36 bits of data, i.e. the divided information bit sequence composed of a 35-bit bit sequence from Element 0 $i_0$ through Element 34 $i_{34}$ of the information bit sequence i, together with Element 7 $p_7$ of the redundant bit sequence p that functions as the parity bit for the divided information bit sequence. Similarly, the second unit transfer and the third unit transfer each involve transferring a 35-bit information bit sequence, and one element of the redundant bit sequence p by way of the parity bit for the divided information bit sequence. Finally, the fourth unit transfer involves transferring a total of 36 bits of data including the remaining elements of the information bit sequence (i.e. the 29-bit divided information bit sequence from Element 105 $i_{105}$ through Element 133 $i_{133}$) and the remaining elements of the redundant bit sequence p (i.e. 7-bit bit sequence from Element 0 $p_0$ through Element 6 $p_6$).

As described previously, in the write process in Embodiment 1, the redundant bit sequence p generated by encoding (Step S130 of FIG. 3) functions as ECC data for implementing single-bit error correction and double-bit error detection, as well as including parity bits for each of the three divided information bit sequences. Each divided information bit sequence, together with its parity bit, is transferred as a single transfer unit.

In accordance with the network relay device 100 of Embodiment 1 which performs the write process in this manner, it is possible to improve error detection/correction capability in data transfers between the frame buffer controller 210 and the frame buffer 220.

Specifically, the existence of the redundant bit sequence p as ECC data makes possible correction of single-bit errors and detection of double-bit errors during data transfers.

Furthermore, it is possible for a single-bit error occurring during a given unit transfer (see FIG. 4B) to be detected due to the existence of the parity bit transferred during the unit transfer in question. Consequently, error detection will be possible even in the event that, for example, a single-bit error occurs in each of the first to third unit transfers, for a total error of three bits. Error detection will also be possible in the event that a single-bit error occurs in the fourth unit transfer as well, for a total error of four bits. A single-bit error could conceivably occur in each single unit transfer in this way in the event that, for example, soft errors occur in the bus 218 (FIG. 1) due to the effects of alpha rays or the like. Such errors are also called "stack faults."

Figure 6:
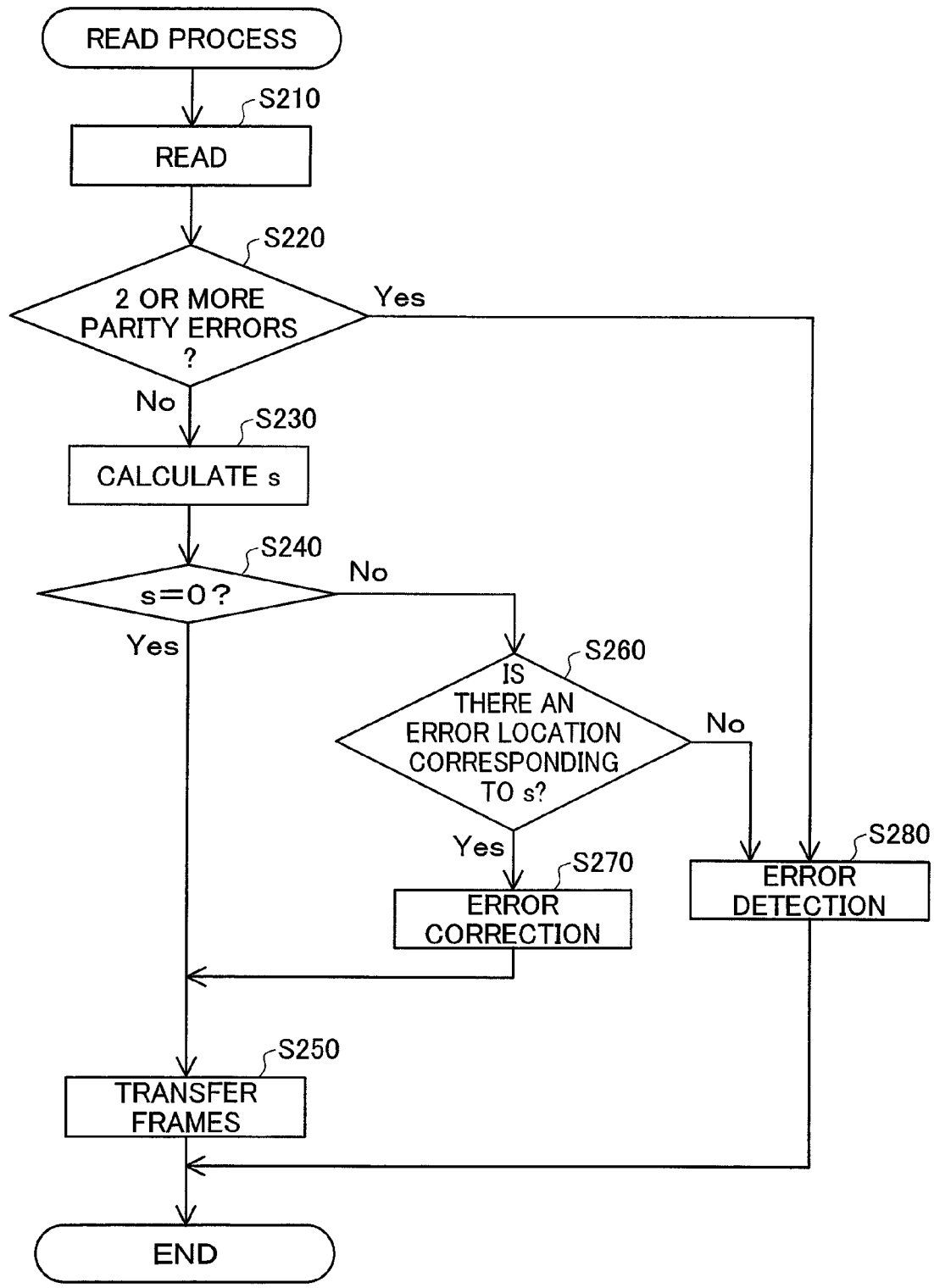
FIG. 6 is a flowchart depicting the flow of the frame data read process in Embodiment 1.

FIG. 6 is a flowchart depicting the flow of the frame data read process in Embodiment 1. The frame data read process is a process whereby the frame buffer controller 210 reads frame data from the frame buffer 220. In Step S210, the frame buffer controller 210 reads the data that was stored in the frame buffer 220 during the write process (FIG. 3). Readout of the data is carried out through burst transfer involving a series of four unit transfer of 36-bit data. The 144-bit data that has been read out is denoted as the read bit sequence $y=(y_0, y_1, \ldots, y_{143})$.

In Step S220 (FIG. 6), error detection is carried out using parity. Specifically, for each of the bit sequences contained in the read bit sequence y and transferred by unit transfer in the first through third unit transfers, the decoder 216 (FIG. 1) of the frame buffer controller 210 decides whether the number of bits with a value of "1" is an even number. In the event that number of bits with a value of "1" in a given bit sequence is not an even number, it is decided that an error of one or more bits has occurred in the unit transfer, i.e. a parity error has occurred. In the event of a determination that parity errors have occurred in two or more unit transfers, it is decided that errors have been detected (Step S280), and the process terminates. In this case, while an error has been detected, the location of the error has not been identified, and therefore a process such as requesting retransmission from the sender of the frame data is carried out.

In the event that no more than one unit transfer is determined to have a parity error in Step S220 (FIG. 6), error correction/detection is carried out using the ECC data, by means of the process beginning with Step S230. Specifically, first, the decoder 216 (FIG. 1) derives a syndrome s on the basis of the read bit sequence y (Step S230). The syndrome s is derived by means of Equation (3).

$$s=Hy^T \quad (3)$$

Figure 7:
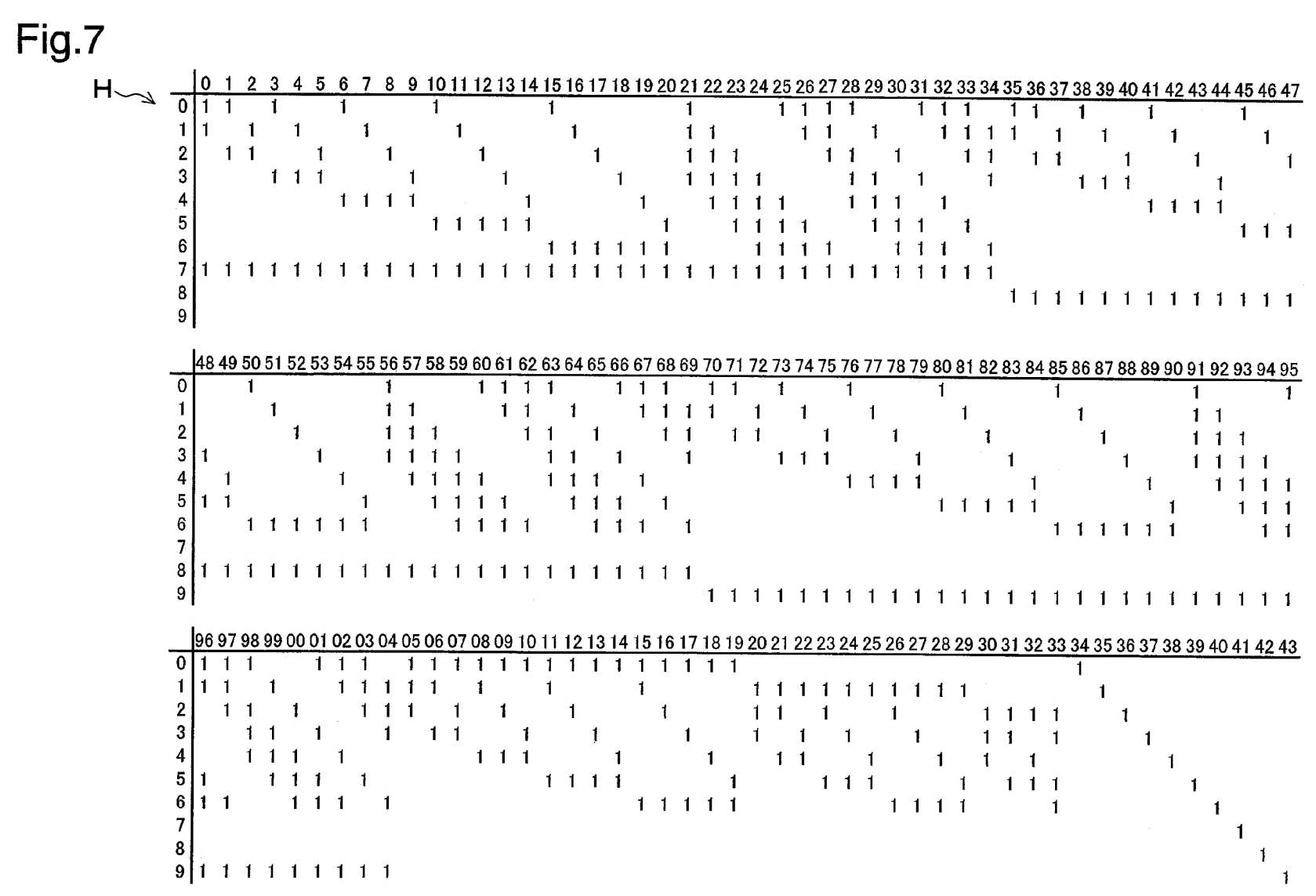

In Equation (3), $y^T$ denotes a transposed matrix of the matrix y. H is a 10×144 matrix. This matrix H is termed the "check matrix H." FIG. 7 is a diagram depicting an exemplary check matrix H in Embodiment 1. As shown in FIG. 7, the check matrix H is a matrix generated by appending a 10×10 unit matrix to the right end of the redundant bit generator matrix P shown in FIG. 5. As will be apparent from Equation (3), the syndrome s is derived as a 10-bit bit sequence.

In Step S240 (FIG. 6), the decoder 216 (FIG. 1) decides whether the all of the bits of the syndrome s have a value of "0." In the event that all of the bits of the syndrome s have a value of "0," the decoder 216 will decide that no error has occurred during transfer of the frame data between the frame buffer controller 210 and the frame buffer 220. In this case, the frame buffer controller 210 will transfer the frame data as-is (Step S250).

If on the other hand in Step S240 it is decided that the syndrome s contains a bit with a value of "1," the decoder 216 (FIG. 1) will detect the error location corresponding to the syndrome s (Step S260). Detection of the error location corresponding to the syndrome s is carried out through lookup on an error location correspondence table CT. FIG. 8 is a diagram depicting an exemplary error location correspondence table CT in Embodiment 1. As shown in FIG. 8, the error location correspondence table CT associates hexadecimal values (denoted as S(16)) when all bits of the syndrome s are viewed as a single number, with error bit locations in the read bit sequence y (denoted as EL(10)). For example, where the value of the syndrome s is "001," through lookup in the error location correspondence table CT it can be determined that the error is at bit 143 in the read bit sequence y.

When the value of the syndrome s is present in the error location correspondence table CT, it is possible to conclude that a single-bit error exists in the read bit sequence y. Through lookup in the error location correspondence table CT, the decoder 216 identifies the location of the error in the read bit sequence y, and corrects the error (Step S270). The frame buffer controller 210 then transmits the frame data contained in the corrected read bit sequence y (Step S250).

If on the other hand, in Step S260 the value of the syndrome s is not present in the error location correspondence table CT, it is possible to conclude that errors have occurred in two or more bits. In this case, it will be decided that errors have occurred (Step S280), and the process will terminate. In this case, a process such as requesting retransmission from the sender of the frame data is carried out.

As discussed above, in accordance with the network relay device 100 of Embodiment 1, encoding of frame data is carried out in such a way that the redundant bit sequence p functions as ECC data for implementing single-bit error correction and double-bit error detection, and contains a parity bit for each of the three divided information bit sequences. The divided information bit sequences, together with their respective parity bits, are then transferred as single transfer units. Consequently, in the network relay device 100 of the present embodiment, even if a single-bit error has occurred in each single unit transfer (such as with a stack fault) for a total of three or more bit errors, the errors can nevertheless be detected. Since part of the ECC data functions as parity bits, there is no increase in the bit length of the redundant bits. Consequently, with the network relay device 100 of the present embodiment, the accuracy of error correction/detection in error control can be improved while minimizing increase in the bit length of the redundant bits.

B. Embodiment 2

Figure 9:
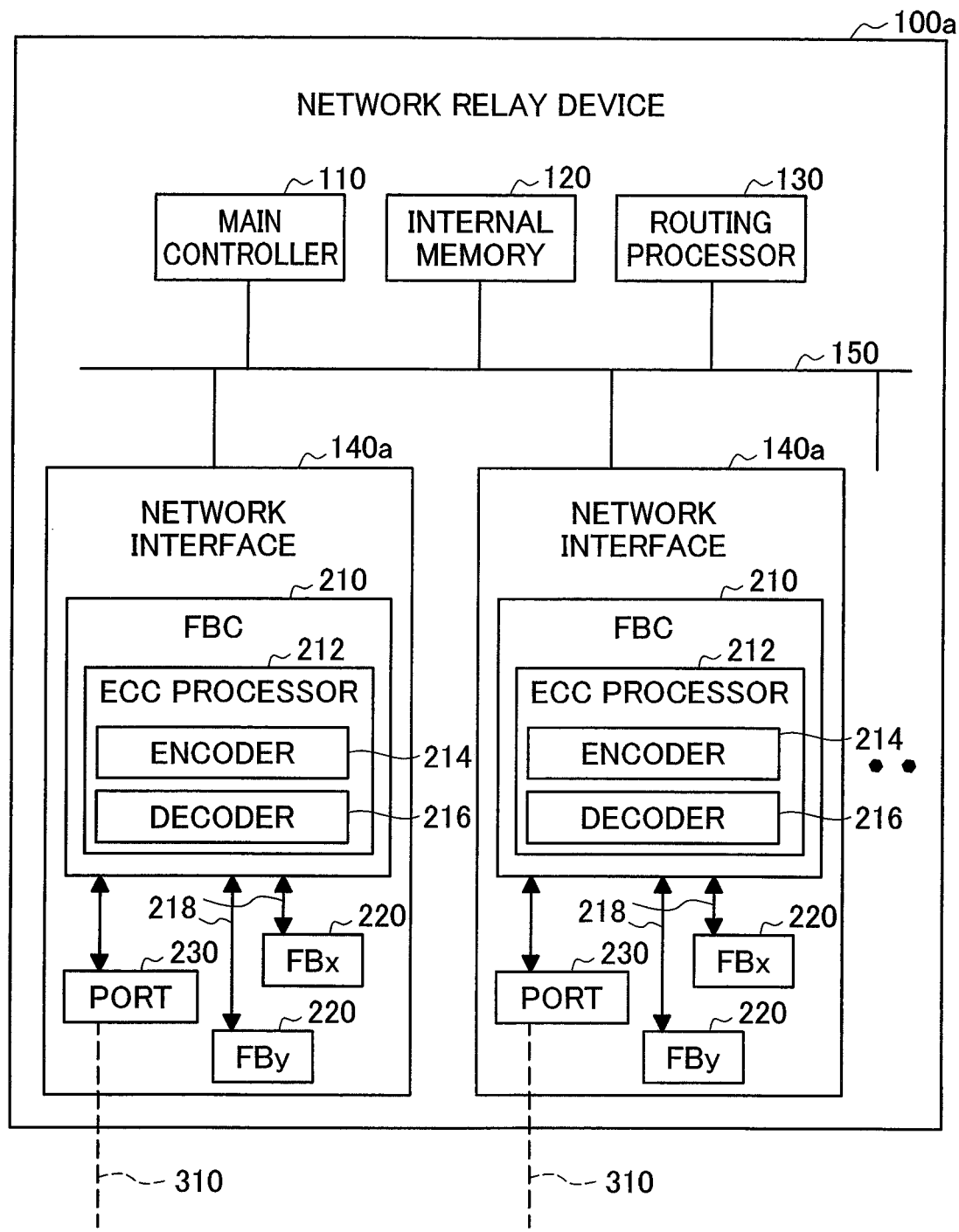
FIG. 9 is a diagram depicting schematically configuration of a network relay device 100a in accordance with Embodiment 2 of the present invention.

FIG. 9 is a diagram depicting schematically configuration of a network relay device 100a in accordance with Embodiment 2 of the present invention. The network relay device 100a of Embodiment 2 differs from the network relay device 100 of Embodiment 1 shown in FIG. 1, in that the network interfaces 140a have two frame buffers 220 (FBx and FBy). The configuration of the network relay device 100a is otherwise similar to that of the network relay device 100 in Embodiment 1.

Figure 10:
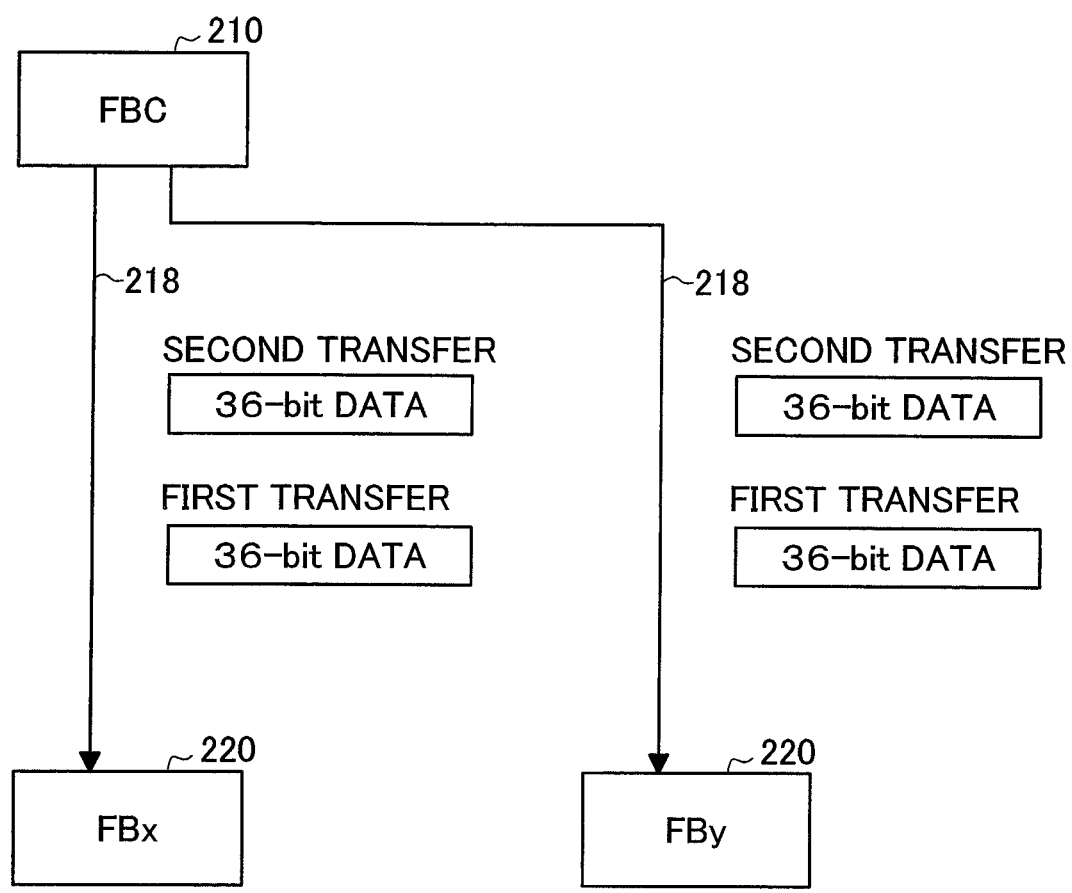
FIG. 10 is a diagram showing an exemplary method of data transfer between the frame buffer controller 210 and the frame buffers 220 in Embodiment 2.

FIG. 10 is a diagram showing an exemplary method of data transfer between the frame buffer controller 210 and the frame buffers 220 in Embodiment 2. FIG. 10 depicts an instance of transfer of data from the frame buffer controller 210 to the two frame buffers 220 (FBx and FBy) for the purpose of writing the data. As shown in FIG. 10, in Embodiment 2, in the case of transfer of 144-bit data for example, a sequence of 72-bit data will be transferred to each of the two frame buffers 220. Transfer of data from the frame buffer controller 210 to a single frame buffer 220 will be carried out through burst transfer in transfer units of 36-bit data.

The flow of the write process in Embodiment 2 is similar to the flow of the write process in Embodiment 1 shown in FIG. 3. Specifically, the frame data is received by the frame buffer controller 210 (Step S110 of FIG. 3), and the frame data is encoded (Step S120 of FIG. 3).

Figure 11A:
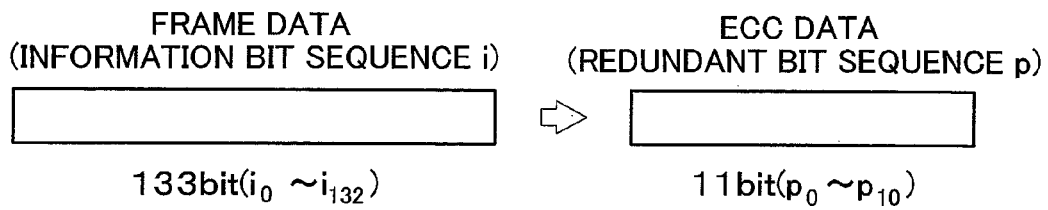
FIGS. 11A and 11B are diagrams showing an exemplary method of encoding frame data in Embodiment 2.
Figure 11B:
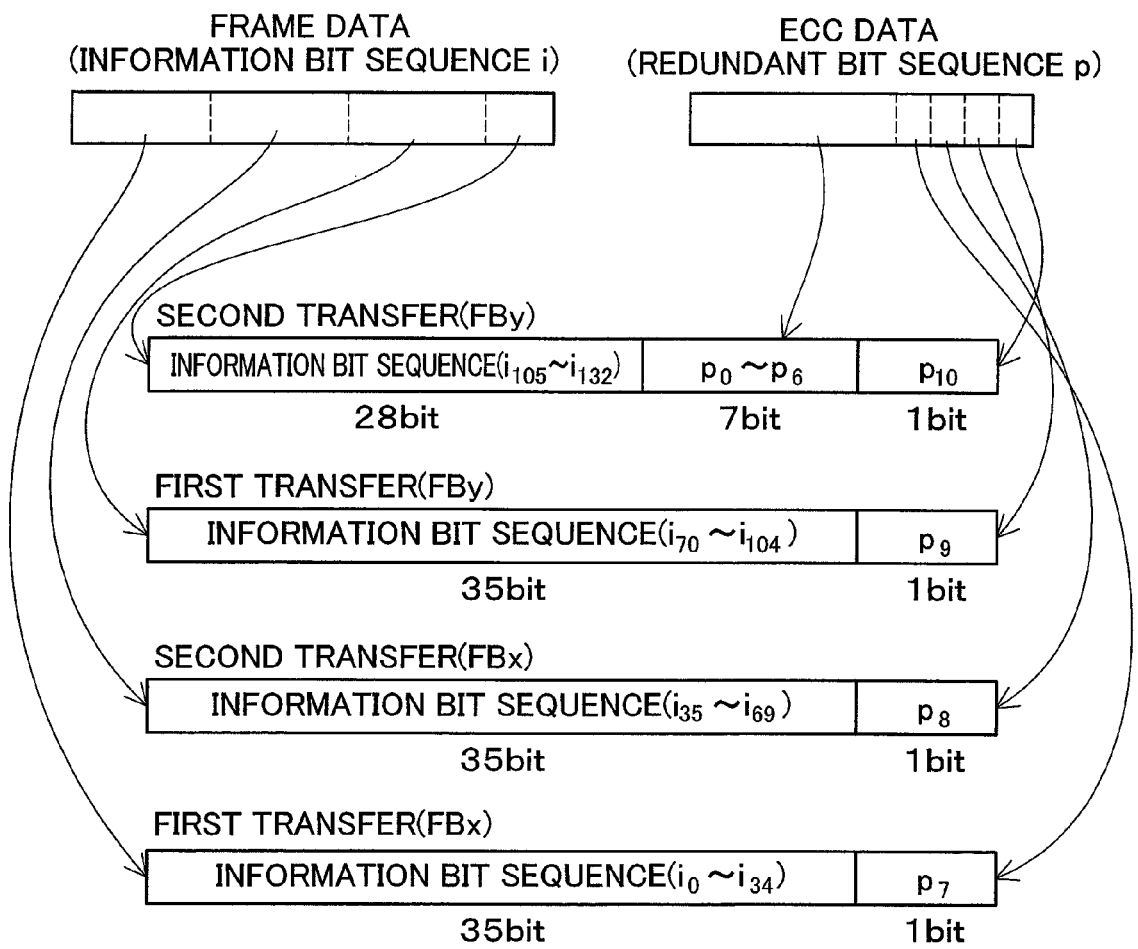

FIGS. 11A and 11B are diagrams showing an exemplary method of encoding frame data in Embodiment 2. In Embodiment 2, frame data consists of 133-bit information bit sequence i. The information bit sequence i is denoted as i={$i_0$, $i_1$, ... $i_{132}$}. The ECC data consists of 11-bit redundant bit sequence p. The redundant bit sequence p is denoted as p={$p_0$, $p_1$, ... $p_{10}$}. As in Embodiment 1, the redundant bit sequence p can be derived by Equation (1) above.

Figure 12:
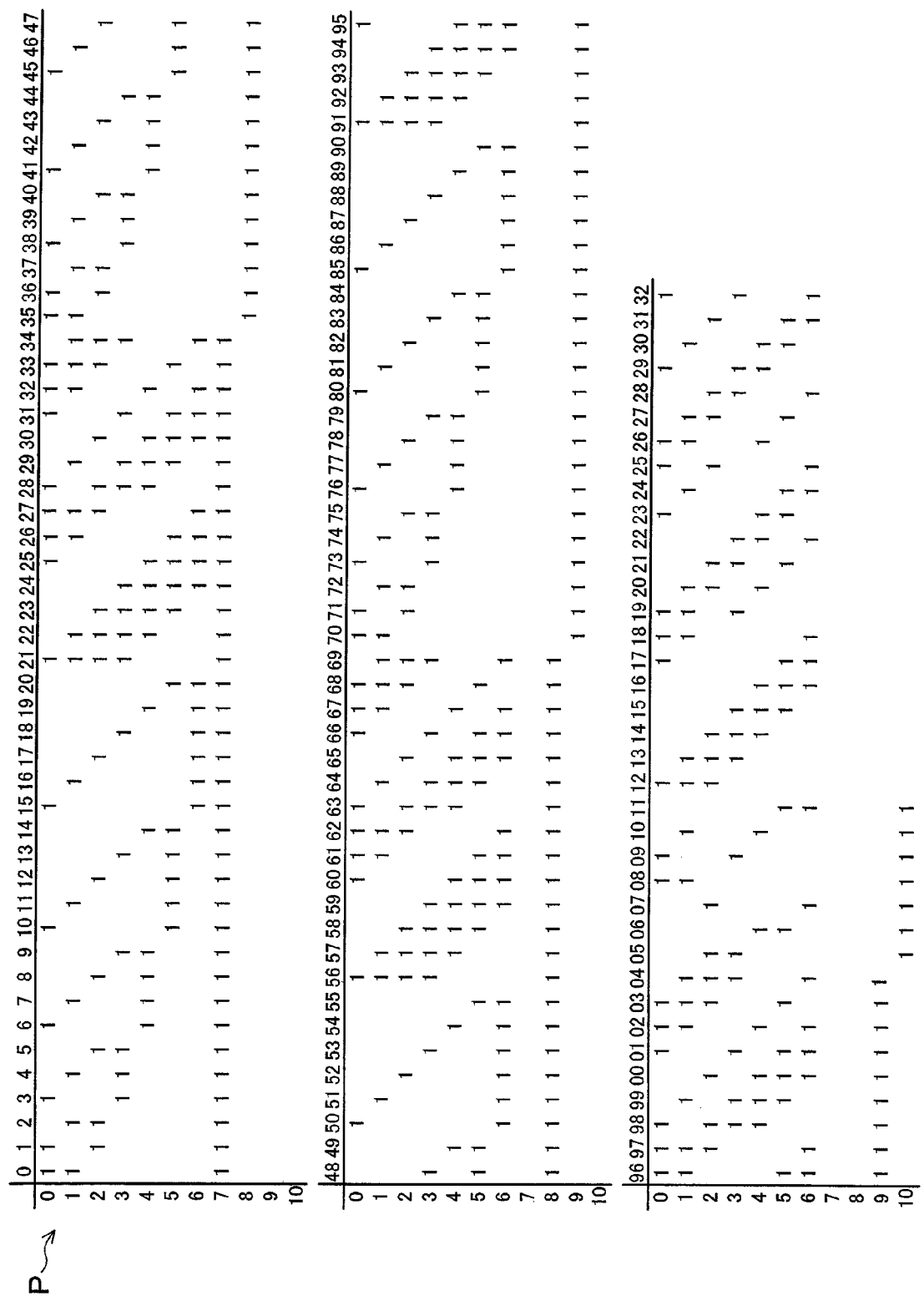
FIG. 12 is a diagram depicting an exemplary redundant bit generator matrix P in Embodiment 2.

FIG. 12 is a diagram depicting an exemplary redundant bit generator matrix P in Embodiment 2. As shown in FIG. 12, the combinations of elements having a value of "0" and elements having a value of "1" in each column (Column 0 to Column 132) of the redundant bit generator matrix P all differ from one another. The number of elements having a value of "1" in each column (e.g. three in Column 0) is an odd number. Encoding carried out using the redundant bit generator matrix P set up in this way makes possible single-bit error correction and double-bit error detection.

Furthermore, as in Embodiment 1, in the redundant bit generator matrix P (FIG. 12), in the bit sequence of Row 7 the 35 elements from Column 0 to Column 34 all have a value of "1," while the rest of the elements in the row all have a value of "0." In the bit sequence of Row 8, the 35 elements from Column 35 to Column 69 all have a value of "1," while the rest of the elements all have a value of "0." Also, in the bit sequence of Row 9, the 35 elements from Column 70 to Column 104 all have a value of "1," while the rest of the elements all have a value of "0." Thus, Element 7 $p_7$ of the redundant bit sequence p will constitute a parity bit (even parity) of Element 0 $i_0$ to Element 34 $i_{34}$ of the information bit sequence i. Element 8 $p_8$ of the redundant bit sequence p will constitute a parity bit of Element 35 $i_{35}$ to Element 69 $i_{69}$ of the information bit sequence i, and element 9 $p_9$ of the redundant bit sequence p will constitute a parity bit of Element 70 $i_{70}$ to Element 104 $i_{104}$ of the information bit sequence 1.

Furthermore, in the redundant bit generator matrix P (FIG. 12) of Embodiment 2, in the bit sequence of Row 10, the seven elements from Column 105 to Column 111 all have a value of "1," while the rest of the elements in the row all have a value of "0." Thus, Element 10 $p_{10}$ of the redundant bit sequence p will constitute a parity bit of Element 105 $i_{105}$ to Element 111 $i_{111}$ of the information bit sequence i. In the present embodiment, in order that the number of elements of the parity computation range of the parity bit represented by Element 10 $p_{10}$ of the redundant bit sequence p be an odd number like that of the other parity bits, the parity computation range extends from Element 105 $i_{105}$ to Element 111 $i_{111}$; however, the parity computation range of Element 10 $p_{10}$ can be set arbitrarily.

When encoding of the frame data is completed, writing of the data (the information bit sequence i and the redundant bit sequence p) to the frame buffer 220 is carried out (Step S130 in FIG. 3). In Embodiment 2, the data is divided for writing to the two frame buffers 220 (FBx and FBy). The configuration of the data transferred to each frame buffer 220 is shown in FIG. 11B. As shown in FIG. 11B, in the first unit transfer to one of the frame buffers 220 (FBx), a total of 36 bits of data, i.e. the divided information bit sequence composed of a 35-bit bit sequence from Element 0 $i_0$ through Element 34 $i_{34}$ of the information bit sequence i, together with Element 7 $p_7$ of the redundant bit sequence p that functions as the parity bit for the divided information bit sequence, is transferred. In the second unit transfer to the frame buffer 220 (FBx), a total of 36 bits of data, i.e. the divided information bit sequence composed of Element 35 $i_{35}$ through Element 69 $i_{69}$ of the information bit sequence i, together with the parity bit for the divided information bit sequence (Element 8 $p_8$ of the redundant bit sequence), is transferred.

In the first unit transfer to the other the frame buffer 220 (FBy), a total of 36 bits of data, i.e. the divided information bit sequence from Element 70 $i_{70}$ through Element 104 $i_{104}$ of the information bit sequence i, together with the parity bit for the divided information bit sequence (Element 9 $p_9$ of the redundant bit sequence), is transferred. In the second unit transfer to the frame buffer 220 (FBy), a total of 36 bits of data including the divided information bit sequence from Element 105 $i_{105}$ through Element 132 $i_{132}$ of the information bit sequence i, the remaining elements of the redundant bit sequence (i.e. the 7-bit bit sequence from Element 0 $p_0$ through Element 6 $p_6$), and the parity bit for Element 105 $i_{105}$ through Element 111 $i_{111}$ (Element 10 $p_{10}$ of the redundant bit sequence p) in the divided information bit sequence are transferred.

Figure 13:
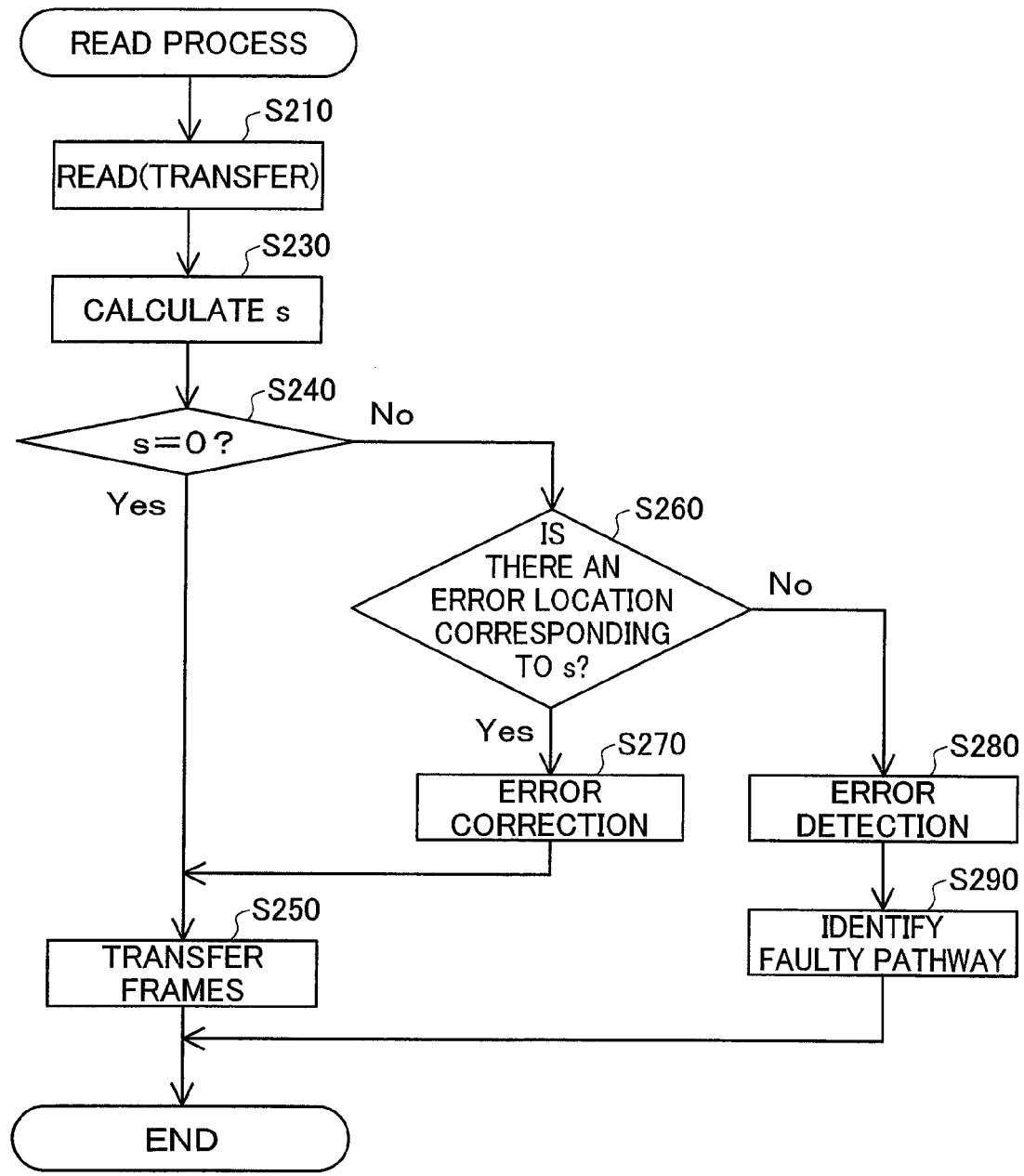
FIG. 13 is a flowchart depicting the flow of the frame data read process in Embodiment 2.
Figure 14:
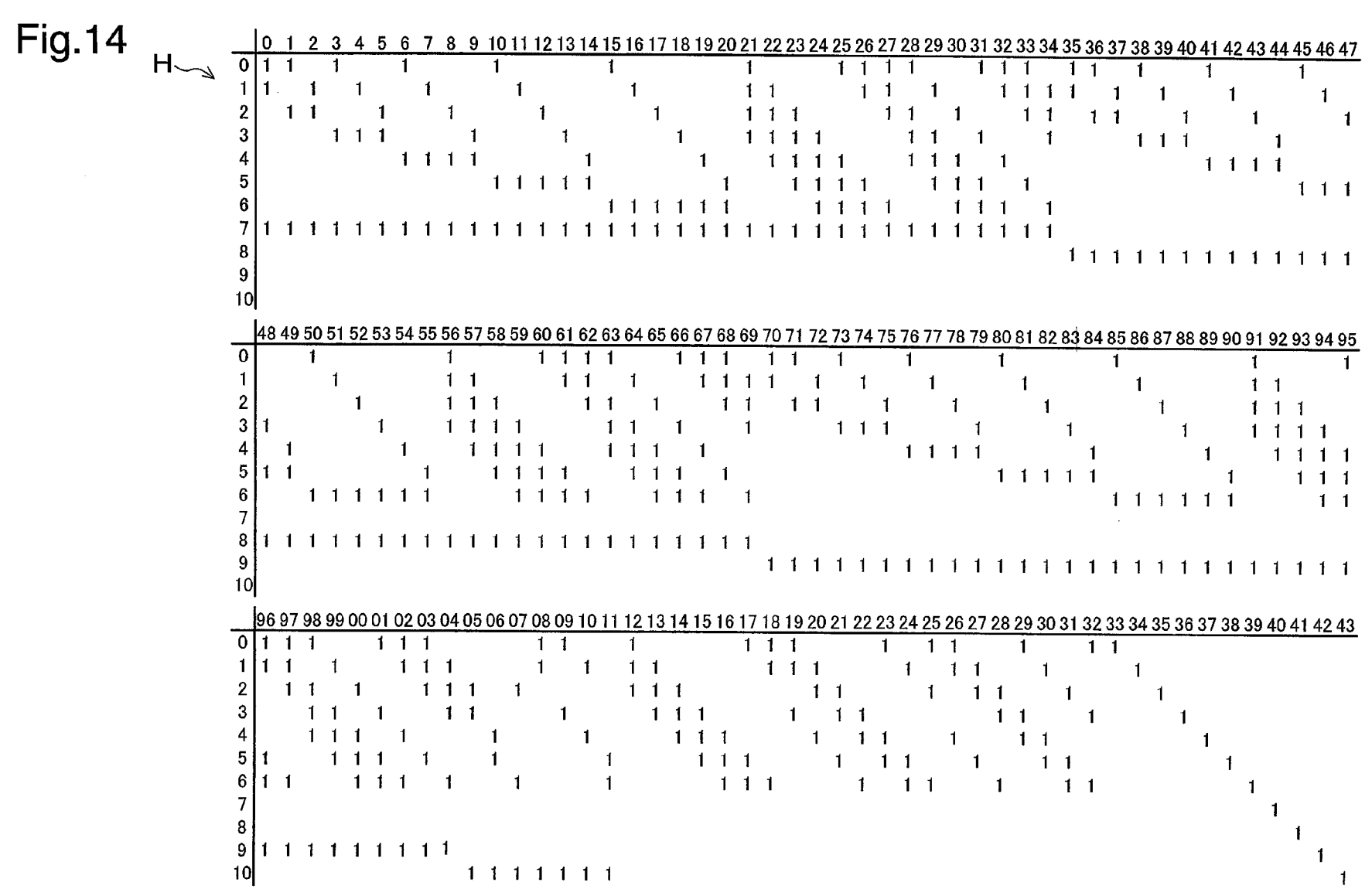

FIG. 13 is a flowchart depicting the flow of the frame data read process in Embodiment 2. The process from Steps S210 to S280 in the frame data read process in Embodiment 2 is the same as in Embodiment 1 shown in FIG. 6. FIG. 14 is a diagram depicting an exemplary check matrix H in Embodiment 2. As shown in FIG. 14, the check matrix H is a matrix generated by appending an 11×11 unit matrix to the right end of the redundant bit generator matrix P shown in FIG. 12. This check matrix H is employed in carrying out calculation of the syndrome s in Step S230 (FIG. 13). FIG. 15 is a diagram depicting an exemplary error location correspondence table CT in Embodiment 2. This exemplary error location correspondence table CT is employed in carrying out identification of the error location in Step S260 (FIG. 13).

The read process of Embodiment 2 differs from that of Embodiment 1 in that, after error detection (Step S280), the pathway on which the fault causing the error (Step S290) is identified. Embodiment 2 employs encoding using a code that enables single-bit error correction and double-bit error detection. Specifically, in the event that a single-bit error has occurred, error correction is performed in Step S270. In the event that a double-bit error has occurred, error detection is performed in Step S280. Step S290 is a process for identifying the transmission pathway on which a double-bit error has occurred. In a device like that of Embodiment 2 configured so that data is transferred from a transfer source to multiple transfer destinations, identification of the faulty pathway is useful in that the range for repair or replacement of parts can be limited.

The parity bit (see FIG. 11B) contained in each of the unit transfers is utilized in identifying the faulty pathway in Step S290 (FIG. 13). FIG. 16 is a diagram showing an exemplary method of identifying a faulty pathway using the parity bit. For example, in the event that a parity error has occurred during the first unit transfer and during the second unit transfer (see FIG. 11B) to the frame buffer 220 (FBx) (Case 1 in FIG. 16), it may be concluded that single-bit errors occurred during the respective transfers. Consequently, in this case it will be determined that a fault has occurred on the transfer pathway from the frame buffer controller 210 to the frame buffer 220 (FBx).

Similarly, in the event that a parity error has occurred during the first unit transfer and during the second unit transfer (see FIG. 11B) to the frame buffer 220 (FBy) (Case 2 in FIG. 16), it may be concluded that single-bit errors occurred during the respective transfers. Consequently, in this case it will be determined that a fault has occurred on the transfer pathway from the frame buffer controller 210 to the frame buffer 220 (FBy). In the event that a parity error has occurred only during the first unit transfer to the frame buffer 220

(FBy) (Case 3 in FIG. 16), it may be concluded that another error has occurred in a bit outside the parity bit calculation range in the second transfer to the frame buffer 220 (FBy). Accordingly, in this case as well, it will be determined that a fault has occurred on the transfer pathway from the frame buffer controller 210 to the frame buffer 220 (FBy).

As described above, in accordance with the network relay device 100a of Embodiment 2, it is possible to identify the pathway on which a fault (error) has occurred during transfer of data between the frame buffer controller 210 and the frame buffers 220.

C. Variations

The present invention is not limited to the embodiments and aspects described above. The present invention may be worked in various aspects within limits that involve no departure from the spirit of the invention; for example, the following variations are possible.

C1. Variation 1

The configuration of the network relay device 100 in the preceding embodiments is merely exemplary, and other configurations of the network relay device 100 are possible as well. The present invention is not limited to data transfer in the network relay device 100, and is applicable generally to data transfer accompanied by error control.

C2. Variation 2

The configuration of the information bit sequence i and the redundant bit sequence p, the encoding method, the configuration of the redundant bit generator matrix P and the check matrix H, the mode of data transfer and so on in the preceding embodiments are merely exemplary, and these configurations and associations may be modified in various ways. For example, whereas the preceding embodiments employ code enabling single-bit error correction and double-bit error detection, code with higher error correction/error detection capabilities could be employed instead. Specifically, where code enabling t-bit error detection (where t is an integer equal to 1 or greater) is employed, encoding can be carried out so that the ECC data contains parity bits for (t+1) or more divided information bit sequences.

The present invention is not limited to carrying out burst transfer of data, and is applicable to all modes of data transfer.

C3. Variation 3

In the preceding embodiments, some of the arrangements implemented through hardware could instead be replaced by software, and conversely some of the arrangements implemented through software could instead be replaced by hardware.

What is claimed is:

1. An information processing device for implementing error control including at least one of error detection and error correction, the device comprising:
   an information bit sequence acquiring unit for acquiring an information bit sequence;
   an encoder for generating a redundant bit sequence enabling execution of error control of the entire information bit sequence, the redundant bit sequence including a first bit sequence that consists of at least one bit that functions as a parity bit for one of a plurality of divided information bit sequences produced by dividing the information bit sequence, the redundant bit sequence being generated through a single encoding by a predetermined code based on the information bit sequence, and for generating a codeword that includes the information bit sequence and the redundant bit sequence; and
   a transfer unit for dividing the codeword into a plurality of successive unit transfers and transferring each of said unit transfers to a transfer destination,
   wherein each of said unit transfers includes a divided information bit sequence and a bit functioning as the parity bit for a division of the information bit sequence; and
   wherein the transfer unit transfers one of said unit transfers to one transfer destination and transfers another one of said unit transfers to another transfer destination.

2. An information processing device according to claim 1, wherein
   the predetermined code is a code enabling t-bit error detection (where t is an integer equal to 1 or greater), and
   at least (t+1) bits included in the redundant bit sequence function as parity bits for the divided information bit sequences.

3. An information processing device according to claim 1, wherein the redundant bit sequence includes a second bit sequence that consists of at least one bit that is used for the error control of the entire information bit sequence and that does not function as a parity bit for one of the plurality of divided information bit sequences.

4. An information processing device for implementing error control including at least one of error detection and error correction, the device comprising:
   a codeword acquiring unit for acquiring a codeword including an information bit sequence and a redundant bit sequence, the redundant bit sequence being generated through a single encoding by a predetermined code and enabling execution of error control of the entire information bit sequence, the redundant bit sequence having a bit that functions as a parity bit for at least one of a plurality of divided information bit sequences produced by dividing the information bit sequence; and
   a decoder for performing decoding based on the codeword, wherein the decoder performs error control in the entire information bit sequence based on the redundant bit sequence and performs error detection in the divided information bit sequence based on the bit belonging to the redundant bit sequence and functioning as a parity bit; and
further comprising:
   a transfer unit for dividing the codeword into a plurality of successive unit transfers and transferring each of said unit transfers to a transfer destination,
   wherein each of said unit transfers includes a divided information bit sequence and a bit functioning as a parity bit for a division of the information bit sequence; and
   wherein the transfer unit transfers one of said unit transfers to one transfer destination.

5. An information processing method for implementing error control including at least one of error detection and error correction, the method comprising the steps of:
   (a) acquiring an information bit sequence;
   (b) generating a redundant bit sequence enabling execution of error control of the entire information bit sequence, the redundant bit sequence including a first bit sequence that consists of at least one bit that functions as a parity bit for one of a plurality of divided information bit sequences produced by dividing the information bit sequence, the redundant bit sequence being generated through a single encoding by a predetermined code based on the information bit sequence and generating a codeword that includes the information bit sequence and the redundant bit sequence;

(c) dividing the codeword into a plurality of successive unit transfers and transferring each of said unit transfers to a transfer destination, wherein each of said unit transfers includes a divided information bit sequence and a bit functioning as the parity bit for a division of the information bit sequence; and wherein the step (c) is a step whereby one of said unit transfers is transferred to one transfer destination and another one of said unit transfers is transferred to another transfer destination.

6. An information processing method according to claim 5, wherein the predetermined code is a code enabling t-bit error detection (where t is an integer equal to 1 or greater), and the step (b) is a step whereby at least (t+1) bits included in the redundant bit sequence function as parity bits for the divided information bit sequences.

7. An information processing method for implementing error control including at least one of error detection and error correction, the method comprising the steps of:

(a) acquiring a codeword including an information bit sequence and a redundant bit sequence, the redundant bit sequence being generated through a single encoding by a predetermined code and enabling execution of error control of the entire information bit sequence, the redundant bit sequence having a bit that functions as a parity bit for at least one of a plurality of divided information bit sequences produced by dividing the information bit sequence; and (b) performing decoding based on the codeword, wherein the step (b) is a step whereby error control in the entire information bit sequence is performed based on the redundant bit sequence and error detection in the divided information bit sequence is performed based on the bit belonging to the redundant bit sequence and functioning as a parity bit; and further comprising:

(c) dividing the codeword into a plurality of successive unit transfers and transferring each of said unit transfers to a transfer destination, wherein each of said unit transfers includes a divided information bit sequence and a bit functioning as the parity bit for a division of the information bit sequence; and wherein the step (c) is a step whereby one of said unit transfers is transferred to one transfer destination and another one of said unit transfers is transferred to another transfer destination.

8. A computer program product for implementing error control including at least one of error detection and error correction, the computer program product comprising:

a computer readable medium; and a computer program stored on the computer readable medium, the computer program comprising:

a first program for causing a computer to acquire an information bit sequence;

a second program for causing the computer to generate a redundant bit sequence enabling execution of error control of the entire information bit sequence, the redundant bit sequence including a first bit sequence that consists of at least one bit that functions as a parity bit for one of a plurality of divided information bit sequences produced by dividing the information bit sequence, the redundant bit sequence being generated through a single encoding by a predetermined code based on the information bit sequence and to generate a codeword that includes the information bit sequence and the redundant bit sequence; and a third program for causing the computer to divide the codeword into a plurality of successive unit transfers and transfer each of said unit transfers to a transfer destination, wherein each of said unit transfers includes a divided information bit sequence and a bit functioning as the parity bit for a division of the information bit sequence; and wherein the third program causes the computer to transfer one of said unit transfers to one transfer destination and to transfer another one of said unit transfers to another transfer destination.

9. A computer program product for implementing error control including at least one of error detection and error correction, the computer program product comprising:

a computer readable medium; and a computer program stored on the computer readable medium, the computer program comprising:

a first program for causing a computer to acquire a codeword including an information bit sequence and a redundant bit sequence, the redundant bit sequence being generated through a single encoding by a predetermined code and enabling execution of error control of the entire information bit sequence, the redundant bit sequence having a bit that functions as a parity bit for at least one of a plurality of divided information bit sequences produced by dividing the information bit sequence; and a second program for causing the computer to perform decoding based on the codeword, wherein the second program is a program whereby error control in the entire information bit sequence is performed based on the redundant bit sequence and error detection in the divided information bit sequence is performed based on the bit belonging to the redundant bit sequence and functioning as a parity bit;

further comprising:

a transfer unit for dividing the codeword into a plurality of successive unit transfers and transferring each of said unit transfers to a transfer destination, wherein each of said unit transfers includes a divided information bit sequence and a bit functioning as a parity bit for a division of the information bit sequence; and wherein the transfer unit transfers one of said unit transfers to one transfer destination.

* * * * *